United States Patent
Cao et al.

(10) Patent No.: US 9,455,204 B1
(45) Date of Patent: Sep. 27, 2016

(54) 10 NM ALTERNATIVE N/P DOPED FIN FOR SSRW SCHEME

(71) Applicant: GLOBALFOUNDRIES Inc., Grand Cayman (KY)

(72) Inventors: Huy M. Cao, Rexford, NY (US); Jinping Liu, Ballston Lake, NY (US); Guillaume Bouche, Albany, NY (US); Huang Liu, Mechanicville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/727,143

(22) Filed: Jun. 1, 2015

(51) Int. Cl.
*H01L 21/70* (2006.01)
*H01L 21/8238* (2006.01)
*H01L 27/092* (2006.01)

(52) U.S. Cl.
CPC .......... *H01L 21/823892* (2013.01); *H01L 21/823821* (2013.01); *H01L 21/823878* (2013.01); *H01L 27/0924* (2013.01)

(58) Field of Classification Search
CPC .......... H01L 21/823892; H01L 21/823821; H01L 27/0924; H01L 29/785; H01L 29/66795; H01L 27/0207
See application file for complete search history.

(56) References Cited

U.S. PATENT DOCUMENTS

| | | | | |
|---|---|---|---|---|
| 6,551,885 B1* | 4/2003 | Yu | ............ | H01L 29/458 257/382 |
| 2005/0272190 A1* | 12/2005 | Lee | ............ | H01L 21/28052 438/176 |
| 2009/0111238 A1* | 4/2009 | Kim | ............ | H01L 21/76224 438/425 |
| 2010/0229929 A1* | 9/2010 | Clifton | ............ | H01L 31/028 136/255 |
| 2012/0223331 A1* | 9/2012 | Zhu | ............ | H01L 29/66795 257/77 |
| 2014/0159163 A1* | 6/2014 | Cai | ............ | H01L 27/0886 257/394 |

OTHER PUBLICATIONS

Maynard, "Plasma Doping Update", Applied Materials, Dec. 17, 2014, 22 pages.
Sasaki et al., "B2H6 Plasma Doping with 'In-situ He Pre-amorphization'", Symposium on VLSI Technology and Circuits, Jun. 15-17, 2004, 2 pages.
Felch et al., "Comparison of Ultra-Shallow Junctions with PLAD and Beamline Implantation", Conference on Ion Implantation Technology, Sep. 17-22, 2000, retrieved on Jun. 29, 2015, from http://www.vsea.com/pubs.nsf/ee1a4d608e6e158e88256a7600672bfd/ab128e53b199a51f85256a65006d3846/$FILE/felch_SEB367.pdf, 4 pages.
Sasaki, "A Study on Conformal Plasma Doping Process with Self-regulating Characteristics for Source/drain Extension", Mar. 20, 2012, retrieved on Jun. 29, 2015, from http://www.iwailab.ep.titech.ac.jp/pdf/201203dthesis/sasaki.pdf, 113 pages.
Turnbaugh et al., "Advances in Plasma Doping on FinFETS and other Applications Using PULSION(R)", Ion Beam Services, Jul. 10, 2014, retrieved on Jun. 29, 2015, from http://www.avsusergroups.org/jtg_pdfs/2014_7turnbaugh_IBS.pdf, 31 pages.

* cited by examiner

*Primary Examiner* — Yosef Gebreyesus
(74) *Attorney, Agent, or Firm* — Ditthavong & Steiner, P.C.

(57) ABSTRACT

A method of introducing N/P dopants in PMOS and NMOS fins at the SSRW layer without complicated processing and the resulting device are provided. Embodiments include forming a plurality of p-type and n-type fins on a substrate, the plurality of p-type and n-type fins formed with an ISSG or pad oxide layer; performing an n-well implant into the substrate through the ISSG or pad oxide layer; performing a first SRPD on the ISSG or pad oxide layer of the plurality of p-type fins; performing a p-well implant into the substrate through the ISSG or pad oxide layer; performing a second SRPD on the ISSG or pad oxide layer of the plurality of n-type fins; and driving the n-well and p-well implants and the SRPD dopants into a portion of the plurality of p-type and n-type fins.

20 Claims, 20 Drawing Sheets

10 NM ALTERNATIVE N/P DOPED FIN FOR SSRW SCHEME

TECHNICAL FIELD

The present disclosure relates to complimentary metal-oxide-semiconductor (CMOS) transistors formed using super steep retrograde wells (SSRW). The present disclosure is particularly applicable to the 10 nanometer (nm) technology node and beyond.

BACKGROUND

A known approach for forming N/P doped fins involves depositing a thin film of boron/phosphorous (B/P) doped materials, e.g., phospho-silicate glass (PSG) and boro-silicate glass (BSG), over n-type metal-oxide-semiconductor (NMOS) and p-type metal-oxide-semiconductor (PMOS) fins, respectively, and then driving the dopants into the fin sidewalls by annealing. Adverting to FIG. 1 (a two-dimensional (2D) cross-sectional view), n-type fins 101 and p-type fins 103 are formed by depositing an in-situ steam generation (ISSG) or pad oxide layer 105 over the silicon (Si) pillars 107 formed on a Si substrate 109. The ISSG or pad oxide layer 105 is then removed from an upper surface of the Si pillars 107. Next, a nitride cap 111 is formed on the upper surface of the Si pillars 107 and an oxide cap 113 is formed on an upper surface of the nitride cap 111. A PSG layer 115 is conformally deposited, e.g., to a thickness of 3 nm to 5 nm, over the n-type and p-type fins 101 and 103, respectively, by chemical vapor deposition (CVD). Next, a nitride layer (not shown for illustrative convenience) is conformally deposited, e.g., to a thickness of 0.8 nm to 3.5 nm, over the PSG layer 115 by atomic layer deposition (ALD) or furnace deposition.

Adverting to FIG. 2, an integrated nitride reactive-ion etching (RIE) and a PSG RIE spacer etch are performed. The integrated etch process removes the nitride layer, ISSG or pad oxide layer 105, and PSG layer 115 from on top of and between the n-type fins 101 and p-type fins 103, as well as the oxide cap 113 on each fin. A lithography stack 301, including a spin-on-hardmask (SOH) layer 303, a silicon oxynitride (SiON) layer 305, a buried anti-reflective coating (BARC) layer 307, and photoresist 309, is then formed over the n-type fins 101 and p-type fins 103, and the BARC layer 307 and the photoresist 309 are removed, as depicted in FIG. 3. Adverting to FIG. 4, the lithography stack 301 is opened onto the p-type fins 103. An n-type well (n-well) implant is then performed by implanting phosphorous/arsenic (P/As) into the substrate 109. Next, an integrated nitride spacer SiCoNi™ etch selective to the PSG layer 115 and a PSG spacer (and ISSG or pad oxide) SiCoNi™ etch (both not shown for illustrative convenience) are performed exposing the p-type fins 103, as depicted in FIG. 5. The remainder of the lithography stack 301 is then removed from over the n-type fins 101.

Adverting to FIG. 6, a BSG layer 601, is deposited, e.g., to a thickness of 3 nm to 5 nm, over the n-type and p-type fins 101 and 103, respectively, by chemical vapor deposition (CVD). The BSG layer 601 may pile up in between the n-type fins 101, and the BSG layer 601 is in contact with the p-type fins 103. In contrast, the PSG layer 115 is formed over the ISSG or pad oxide layer 105, which is formed over the Si pillars 107, with respect to the n-type fins 101. Next, a spacer etch back is performed on the BSG layer 601 by RIE, removing approximately 5 nm of the BSG layer 601, as depicted in FIG. 7. The expectation is that since phosphorous diffuses faster than boron, solid state diffusion of phosphorous from PSG can happen through the ISSG or pad oxide layer 105.

Next, a lithography stack 801, including a SOH layer 803, a SiON layer 805, a BARC layer 807, and photoresist 809, is formed over the n-type and p-type fins 101 and 103, respectively, as depicted in FIG. 8. Adverting to FIG. 9, a portion of the lithography stack 801 is removed exposing the n-type fins 101 and the photoresist 809 and the BARC layer 807 are removed. The BSG layer 601 is then etched from the n-type fins 101, e.g., by SiCoNi™, as depicted in FIG. 10. The remainder of lithography stack 801 is then removed. Adverting to FIG. 11, a nitride layer 1101 is deposited over both the n-type and p-type fins 101 and 103, respectively, and the substrate 109. As a result of the n-type fins already having a nitride layer (not shown for illustrative convenience), the total nitride thickness over the n-type fins 101 is much thicker than the nitride layer 1101 formed over the p-type fins 103.

Adverting to FIG. 12, a shallow trench isolation (STI) layer 1201 is formed over the nitride layer 1101. The STI layer 1201 is then planarized, for example, by CMP, down to the upper surface of the Si pillars 107, removing the nitride cap 111. The STI layer 1201 is then recessed 38 nm to 44 nm to expose a portion of the n-type and p-type fins 101 and 103, respectively, as depicted in FIG. 13. The portions of the ISSG or pad oxide layer 105, the PSG layer 115, the BSG layer 601, the nitride layer (not shown for illustrative convenience), and the nitride layer 1101 exposed by the recessed STI layer 1201 are then stripped down to the Si pillars 107. Thereafter, the dopants are driven into the n-type and p-type fins 101 and 103, respectively, using a high temperature anneal process.

Another known approach involves a similar process flow with boron/phospho-silicate glass (B/PSG) doping thin film magnetodielectric (TFM) layers on PMOS and NMOS fins. However, these approaches can require numerous complicated B/PSG deposition and masking steps; lack easy to control dopant profiles; and may cause implant damage/leakage and, therefore, device defectiveness.

A need therefore exists for methodology enabling the introduction of N/P dopants in silicon and the dopants to be driven into the fin areas at the SSRW layer without complicated processing or implant damage/leakage and the resulting device.

SUMMARY

An aspect of the present disclosure is a method of introducing N/P dopants in PMOS and NMOS fins at the SSRW layer without complicated processing.

Another aspect of the present disclosure is a fin field-effect transistor (FinFET) device having B/P doped fins and a SSRW layer formed by ultra-shallow implants.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of p-type and n-type fins on a substrate, the plurality of p-type and n-type fins formed with an ISSG or pad oxide layer; performing an n-well implant into the substrate through the ISSG or pad oxide layer; performing a first self-regulation plasma doping (SRPD) on the ISSG or pad oxide layer of the plurality of p-type fins; performing a p-type well (p-well) implant into the substrate through the ISSG or pad oxide layer; performing a second SRPD on the ISSG or pad oxide layer of the plurality of n-type fins; and driving the n-well and p-well implants and the SRPD dopants into a portion of the plurality of p-type and n-type fins.

Aspects of the present disclosure include forming the plurality of n-type fins by: forming a first and a second group of n-type fins, the first and the second group of n-type fins formed on opposite sides of the plurality of p-type fins. Other aspects include forming the plurality of p-type and n-type fins by: forming the ISSG or pad oxide layer over a plurality of Si pillars formed on the substrate; removing the ISSG or pad oxide layer from an upper surface of the plurality of Si pillars; forming a nitride cap on the upper surface of each Si pillar; and forming an oxide cap on an upper surface of the nitride cap. Further aspects include performing the n-well implant by: forming a lithography stack over the plurality of p-type and n-type fins; removing a portion of the lithography stack over the p-type fins down to the substrate; implanting P/As into the substrate by plasma doping (PLAD); and removing a remaining portion of the lithography stack over the n-type fins down to the substrate. Additional aspects include performing the p-well implant by: forming a lithography stack over the plurality of p-type and n-type fins; removing a portion of the lithography stack over the plurality of n-type fins down to the substrate; implanting boron/boron trifluoride (B/BF$_3$) into the substrate by PLAD; and removing a remaining portion of the lithography stack over the p-type fins down to the substrate. Another factor includes performing the n-well and p-well implants at a dosage of 1e12 per centimeter squared (cm$^{-2}$) to 1e13 cm$^{-2}$ and at an energy of 10 kiloelectron volt (keV) to 100 keV. Other aspects include performing the first and second SRPD dopings at a dosage of 1e19 cm$^{-2}$ to 5e22 cm$^{-2}$ and at an energy of 0.1 keV to 2.5 keV. Further aspects include driving the n-well and p-well implants and the SRPD dopants into the portion of the plurality of p-type and n-type fins by: forming a nitride layer over the plurality of p-type and n-type fins and the substrate; forming a STI layer over the nitride layer; planarizing the STI layer down to an upper surface of a plurality of Si pillars of the p-type and n-type fins; recessing a portion of the STI layer to expose the portion of the plurality of p-type and n-type fins; removing the ISSG or pad oxide and nitride layers from the portion of the plurality of p-type and n-type fins; and annealing the portion of the plurality of p-type and n-type fins at a temperature of 800° C. to 1200° C. Additional aspects include forming the nitride layer to a thickness of 0.8 nm to 3.5 nm by ALD or furnace deposition.

Another aspect of the present disclosure is a method including: forming a plurality of PMOS fins and NMOS fins on a substrate, the plurality of PMOS and NMOS fins formed with an ISSG or pad oxide layer; performing a n-well implant into the substrate through the ISSG or pad oxide layer; performing a first SRPD on the ISSG or pad oxide layer of the plurality of PMOS fins; performing a p-well implant into the substrate through the ISSG or pad oxide layer; performing a second SRPD on the ISSG or pad oxide layer on the plurality of NMOS fins; forming a nitride layer over the plurality of PMOS and NMOS fins; forming a STI layer over the nitride layer; planarizing the STI layer down to an upper surface of a plurality of Si pillars of the plurality of PMOS and NMOS fins; recessing a portion of the STI layer, the recess exposing a portion of the plurality of PMOS and NMOS fins; removing the ISSG or pad oxide and nitride layers from the portion of the plurality of PMOS and NMOS fins; and annealing the portion of the plurality of PMOS and NMOS fins.

Aspects of the present disclosure include forming the plurality of NMOS fins by: forming a first and a second group of NMOS fins, the first and the second group of NMOS fins formed on opposite sides of the plurality of PMOS fins. Other aspects include forming the plurality of PMOS and NMOS fins by: forming the ISSG or pad oxide layer over the plurality of Si pillars formed on the substrate; removing the ISSG or pad oxide layer from a top surface of the plurality of Si pillars; forming a nitride cap on an upper surface of each Si pillar; and forming an oxide cap on an upper surface of the nitride cap. Further aspects include performing the n-well implant by: forming a lithography stack over the plurality of PMOS and NMOS fins; removing a portion of the lithography stack over the PMOS fins down to substrate; implanting P/As into the substrate by PLAD; and removing a remaining portion of the lithography stack over the NMOS fins down to the substrate. Additional aspects include performing the p-well implant by: forming a lithography stack over the plurality of PMOS and NMOS fins; removing a portion of the lithography stack over the plurality of NMOS fins; implanting B/BF$_3$ into the substrate by PLAD; and removing a remaining portion of the lithography stack over the PMOS fins down to the substrate. Another aspect includes performing the n-well and p-well implants at a dosage of 1e12 cm$^{-2}$ to 1e13 cm$^{-2}$ and at an energy of 10 keV to 100 keV. Other aspects include performing the first and second SRPD dopings at a dosage of 1e19 cm$^{-2}$ to 5e22 cm$^{-2}$ and at an energy of 0.1 keV to 2.5 keV. Further aspects include forming the nitride layer to a thickness of 0.8 nm to 3.5 nm by ALD or furnace deposition.

A further aspect of the present disclosure is a device including: PMOS fins and NMOS fins formed on a Si substrate, the PMOS and NMOS fins having a top and a bottom portion; an ISSG or pad oxide layer formed over the bottom portion of the PMOS and NMOS fins; a P/As doped SSRW formed in the substrate under the PMOS fins; a B/BF$_3$ doped SSRW formed in the substrate under the NMOS fins; a nitride layer formed over the ISSG or pad oxide layer; and a STI layer formed on the Si substrate adjacent to and between the bottom portion of the PMOS and NMOS fins.

Aspects of the device include a SRPD being performed on the ISSG or pad oxide layer of the PMOS and NMOS fins. Other aspects include the NMOS firms being formed of a first and a second group of NMOS fins, the PMOS fins being formed as a group of PMOS fins, and the first and second groups of NMOS fins being formed on opposite sides of the group of PMOS fins.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of numerous complicated B/PSG deposition and masking steps, lack of easily controlled dopant profiles, and implant damage/leakage attendant upon forming N/P doped fins for a FinFET device.

Methodology in accordance with embodiments of the present disclosure includes forming a plurality of p-type and n-type fins on a substrate, the plurality of p-type and n-type fins formed with an ISSG or pad oxide layer. An n-well implant is performed into the substrate through the ISSG or pad oxide layer and a SRPD is performed on the ISSG or pad oxide layer of the plurality of p-type fins. A p-well implant is performed into the substrate through the ISSG or pad oxide layer and the SRPD is performed on the ISSG or pad oxide layer of the plurality of n-type fins. The n-well and p-well implants and the SRPD dopants are driven into a portion of the plurality of p-type and n-type fins.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
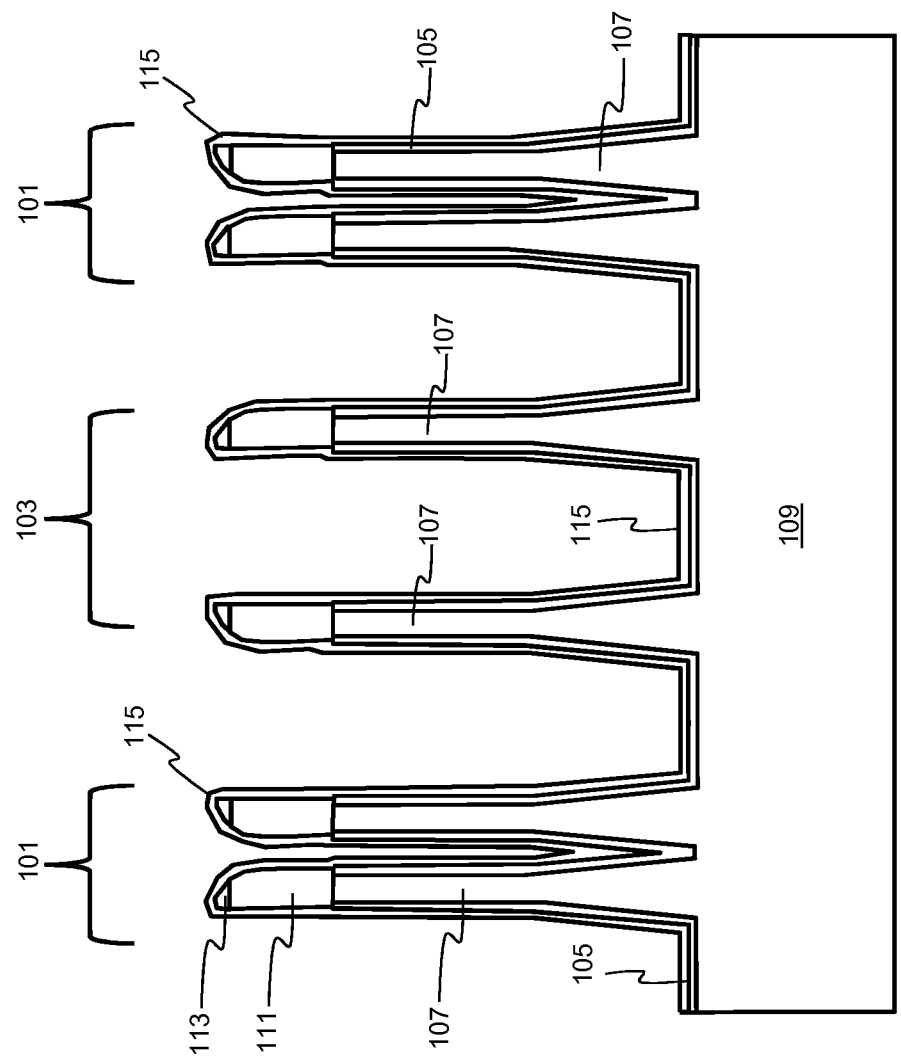
FIGS. 1 through 13 schematically illustrate a background process flow for forming boron-phosphorous doped fins for a FinFET device.
Figure 2:
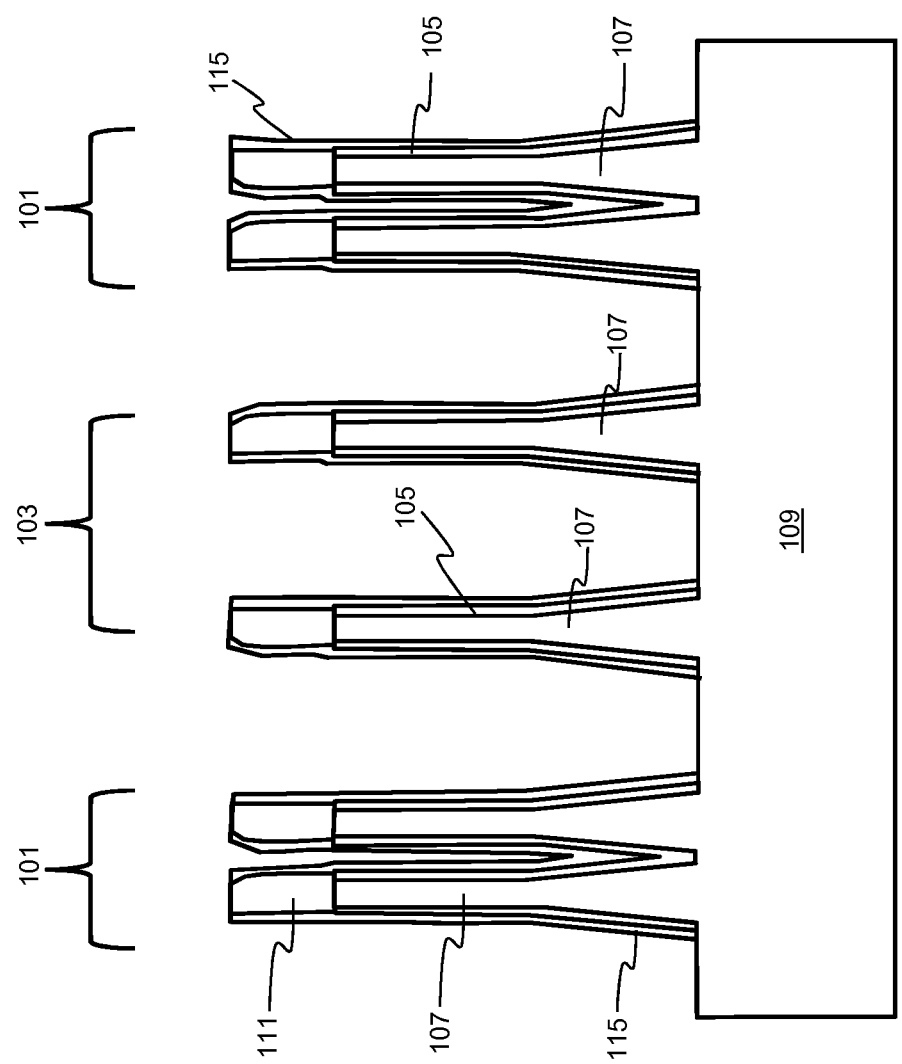
Figure 14:
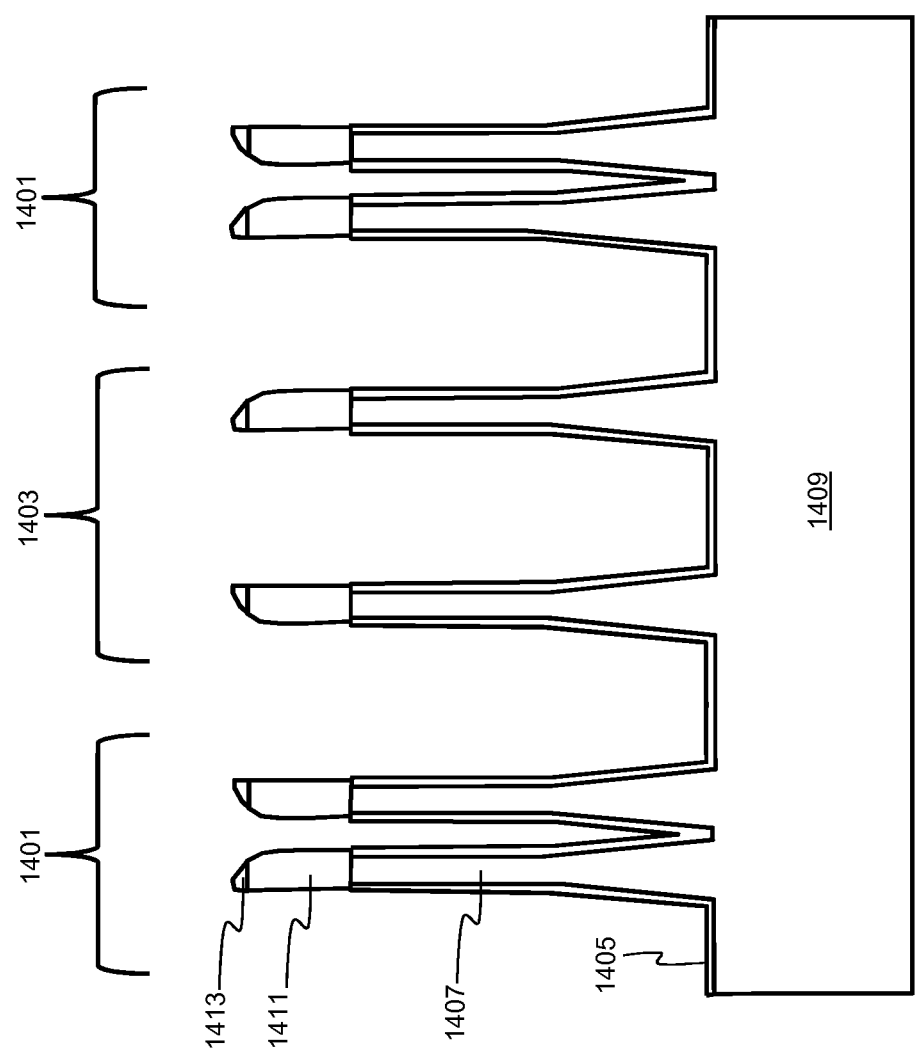
FIGS. 14 through 20 schematically illustrate a process flow for introducing N/P dopants in PMOS and NMOS fins at the SSRW layer without complicated processing, in accordance with an exemplary embodiment.

Adverting to FIG. 14 (a 2D cross-sectional view), similar to the process described with respect to FIG. 1, n-type fins 1401 and p-type fins 1403 are formed by depositing an ISSG or pad oxide layer 1405 over Si pillars 1407 formed on the Si substrate 1409. The ISSG or pad oxide layer 1405 is then removed from an upper surface of the Si pillars 1407 and a nitride cap 1411 is formed on the upper surface of the Si pillars 1407. Next, an oxide cap 1413 is formed on an upper surface of the nitride cap 1411.

Figure 3:
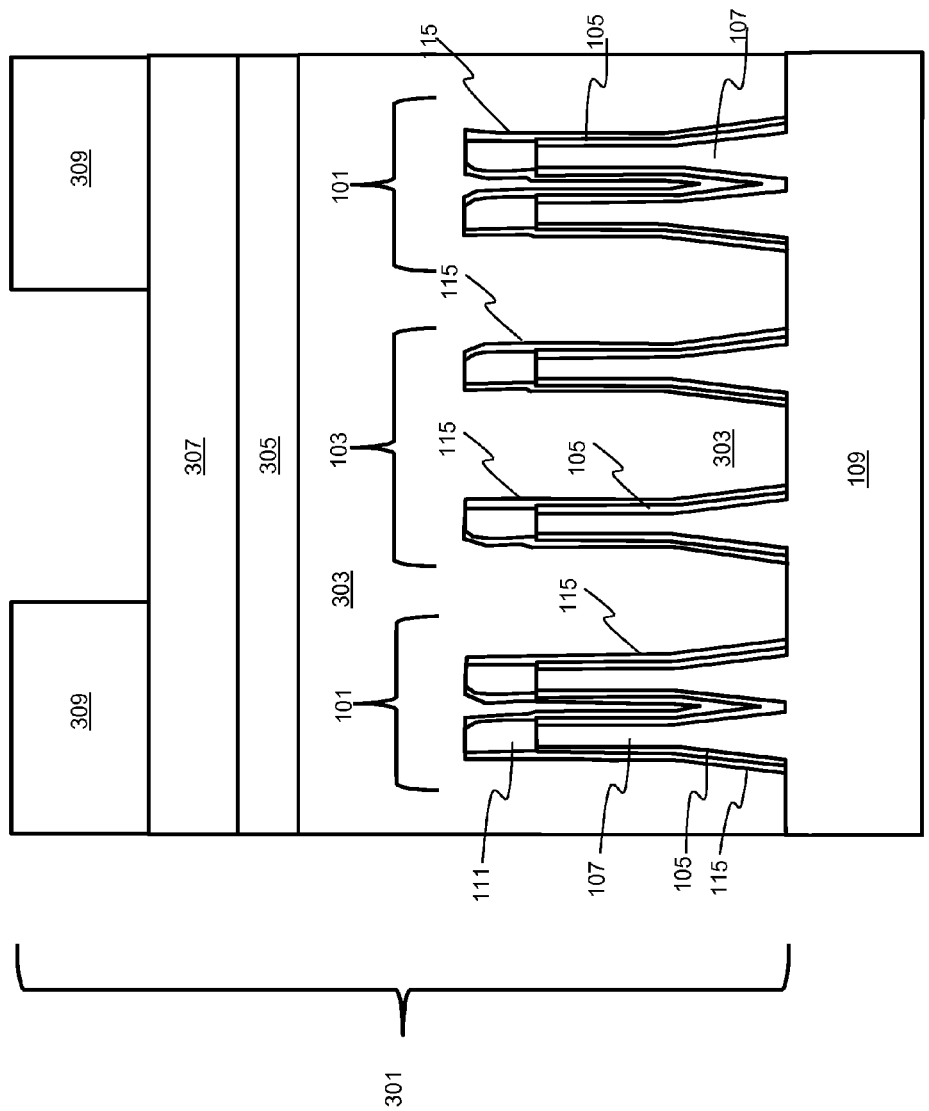
Figure 4:
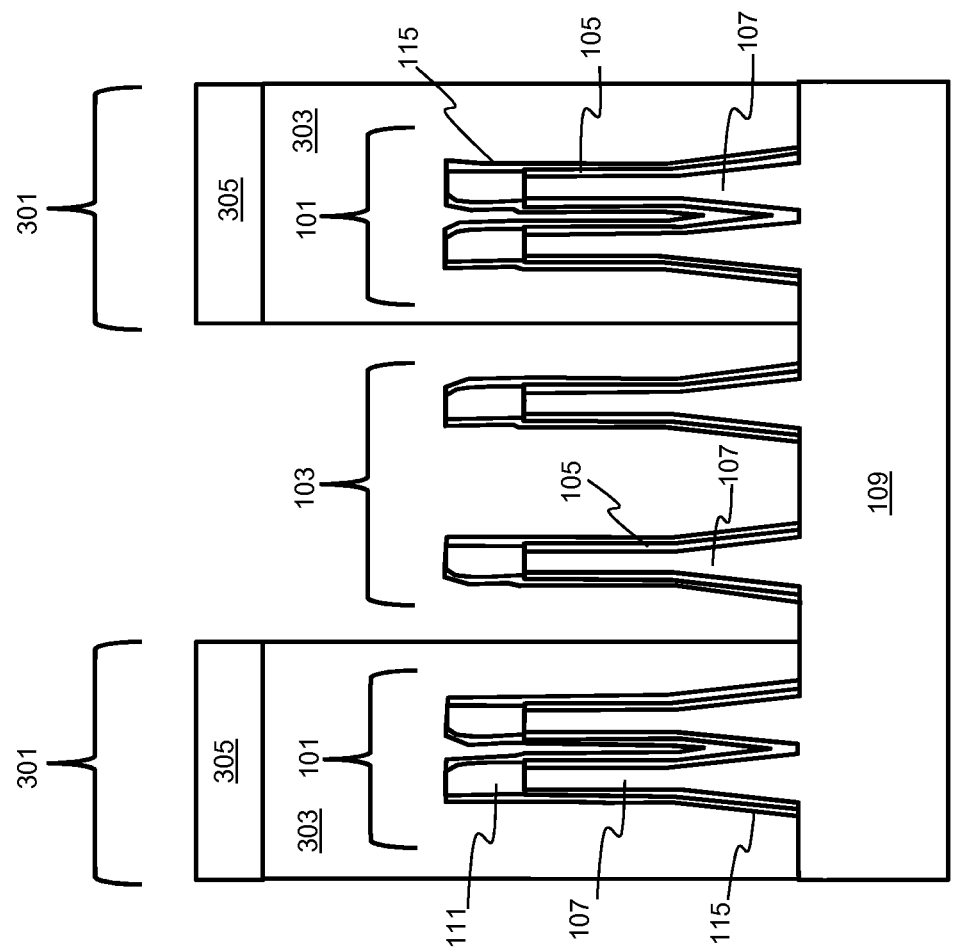
Figure 5:
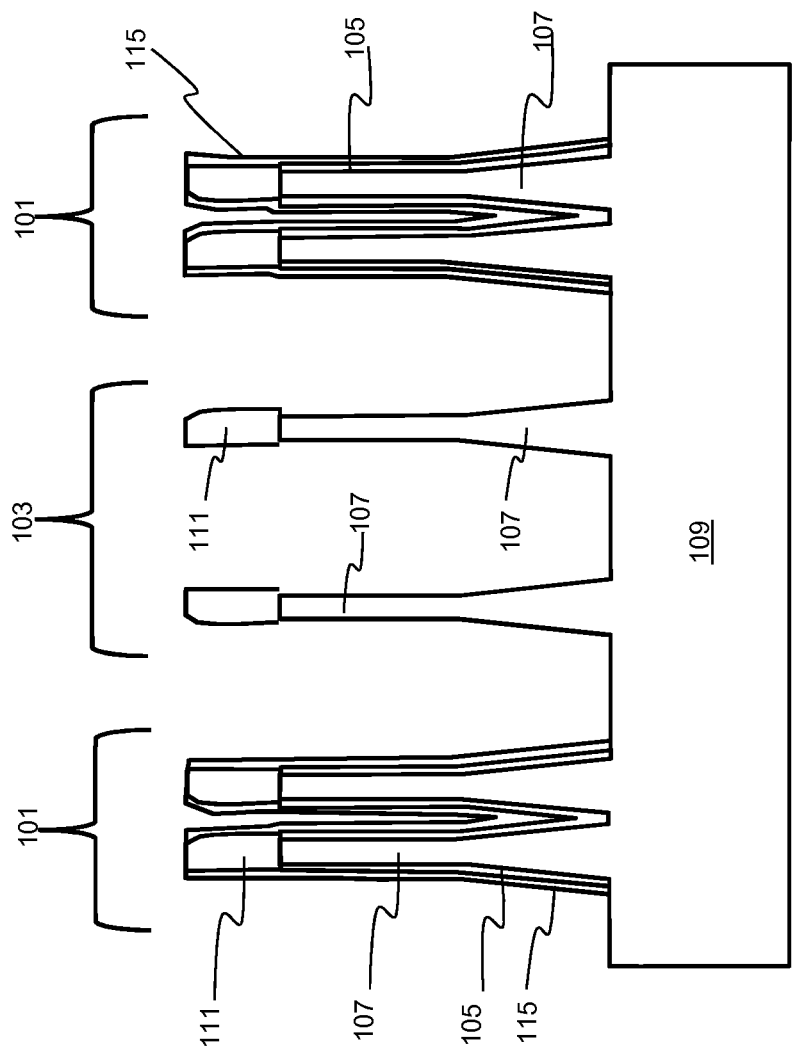
Figure 6:
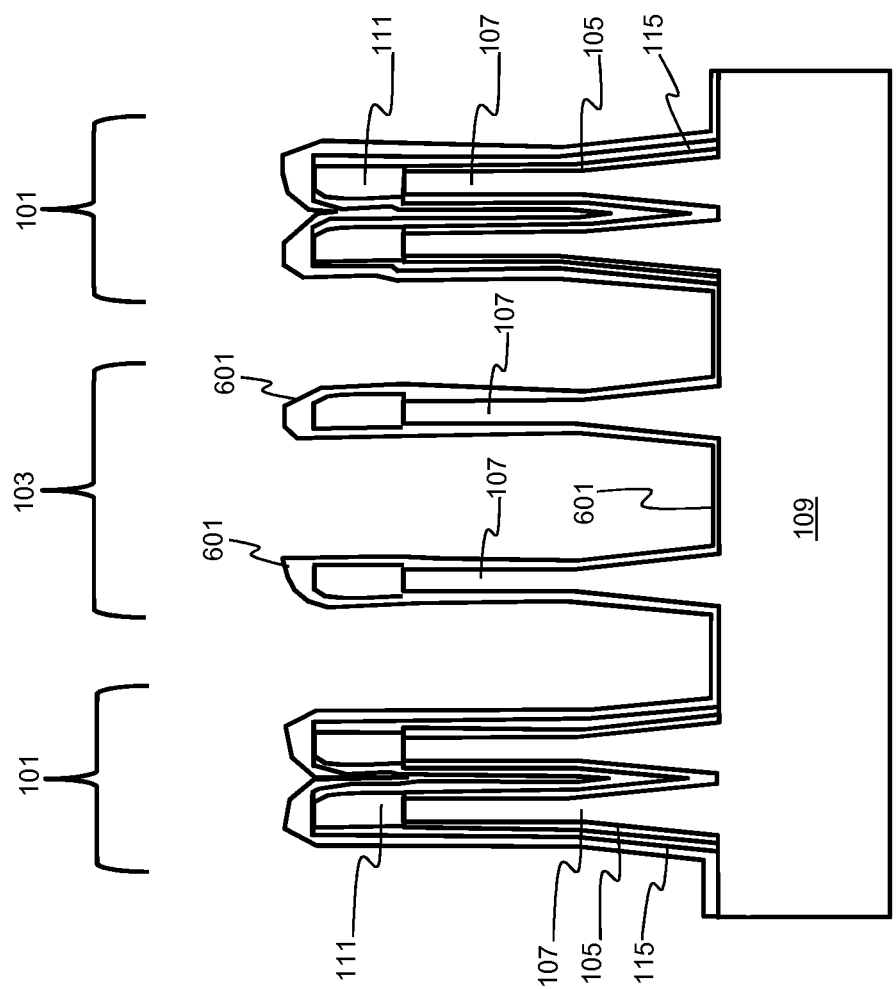
Figure 7:
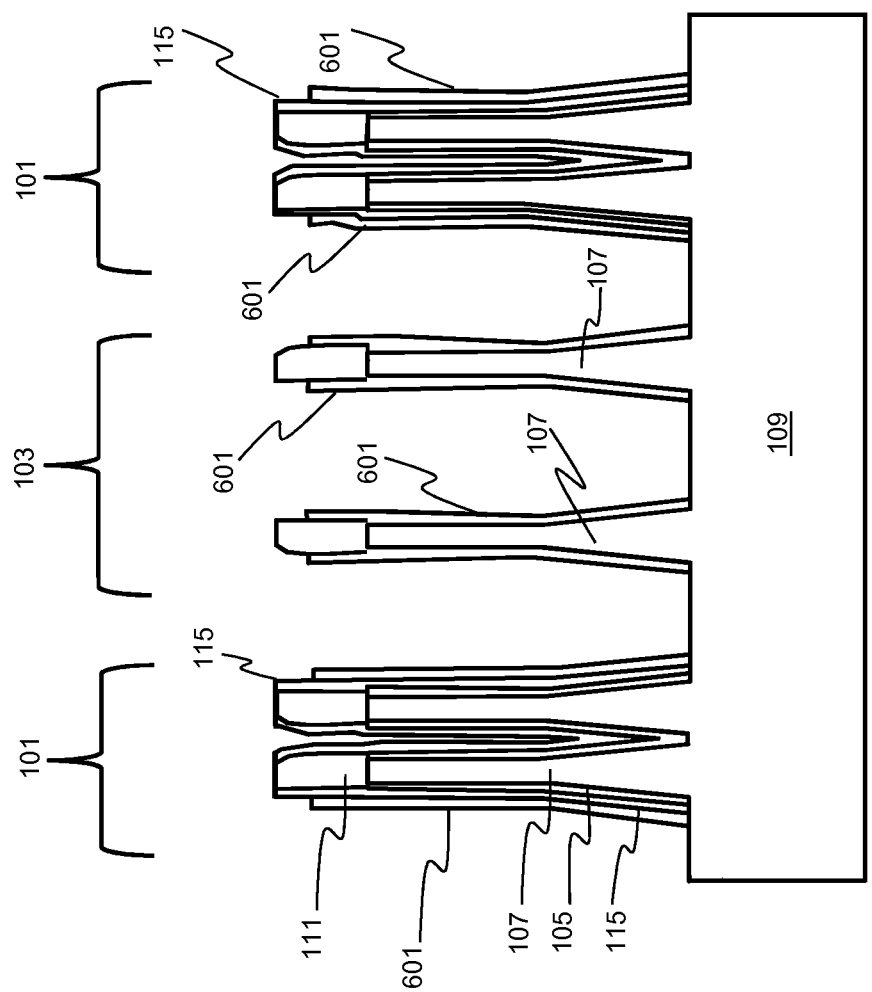
Figure 15:
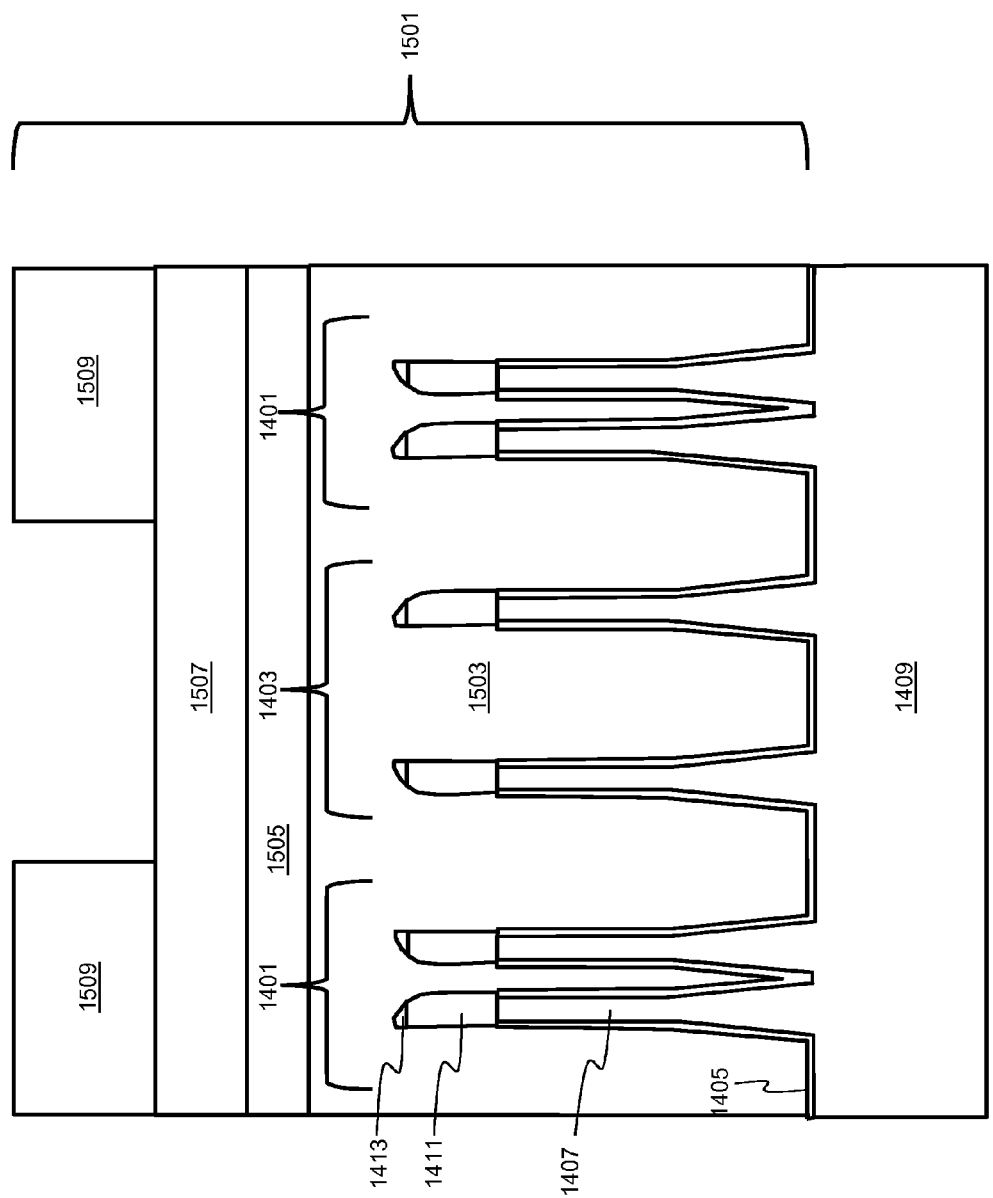
Figure 16:
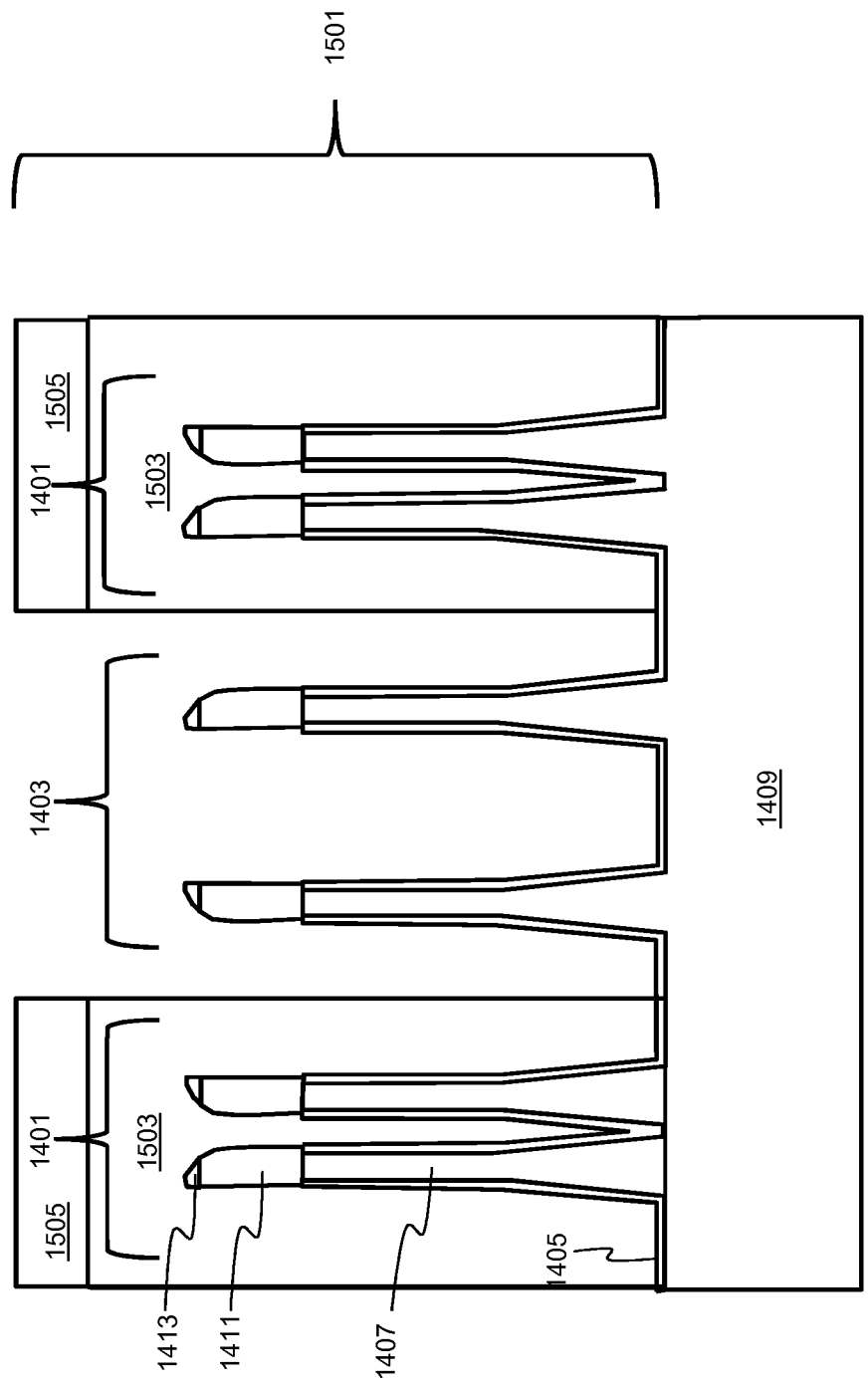

Similar to the process flow described with respect to FIGS. 3 and 4, a lithography stack 1501, including a SOH layer 1503, a SiON layer 1505, a BARC layer 1507, and photoresist 1509, is formed over the n-type and p-type fins 1401 and 1403, respectively, as depicted in FIG. 15. The lithography stack 1501 is then opened onto the p-type fins 1403, and the photoresist 1509 and the BARC layer 1507 are removed, as depicted in FIG. 16. Next, an n-well implant is performed into the substrate 1409 through the ISSG or pad oxide layer 1405 of the p-type fins 1403. The n-well implant may be performed, for example, by implanting the substrate 1409 with P/As by PLAD, for example. The n-well implant forms a doped SSRW in the substrate 1409 under the p-type fins 1403. The n-well implant may be performed, for example, at a dosage of 1e12 $cm^{-2}$ to 1e13 $cm^{-2}$ and at an energy of 10 keV to 100 keV. Before, the remainder of the lithography stack 1501 is removed, a SRPD is also performed on the ISSG or pad oxide layer 1405 of the p-type fins 1403. The SRPD may be performed, for example, at a dosage of 1e19 $cm^{-2}$ to 5e22 $cm^{-2}$ and at an energy of 0.1 keV to 2.5 keV. The remainder of the lithography stack 1501 is then removed from over the n-type fins 1401, down to the substrate 1409.

Figure 8:
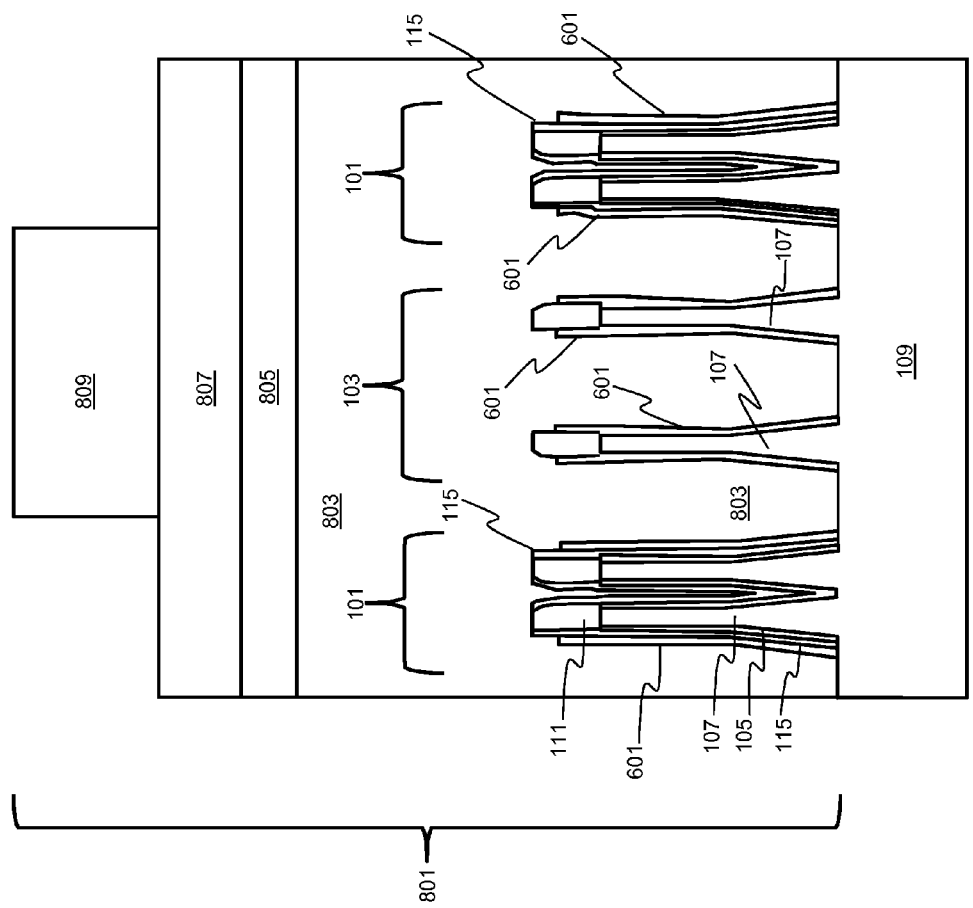
Figure 9:
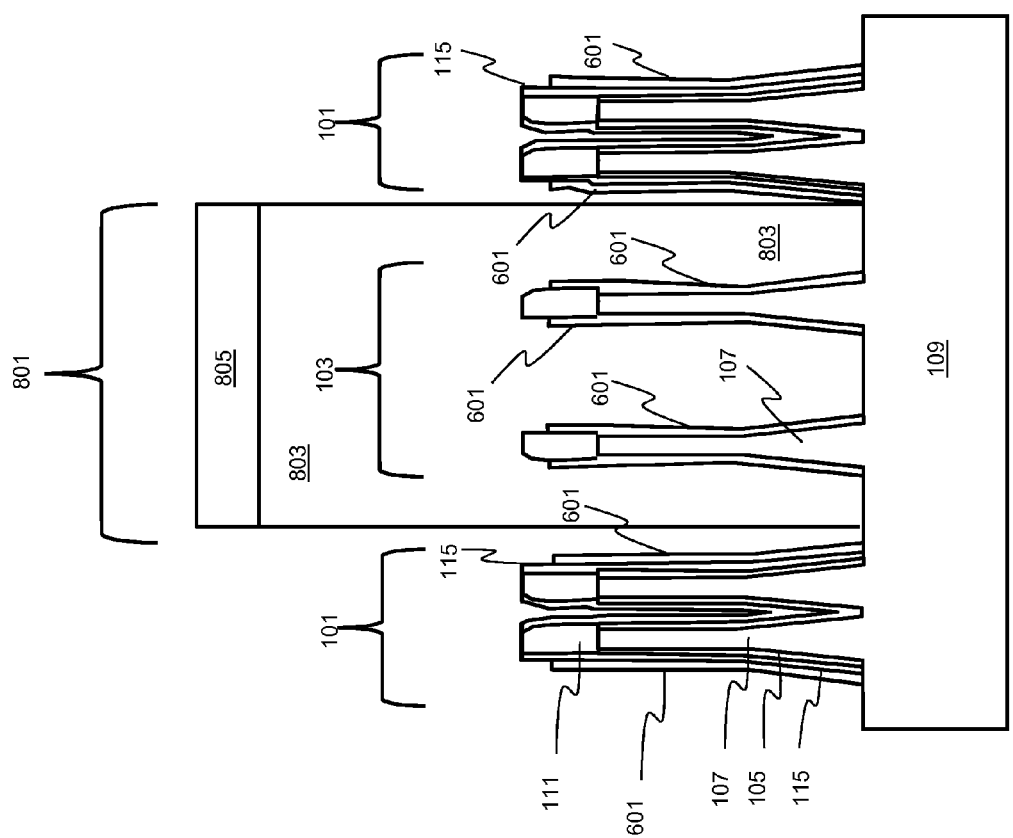
Figure 10:
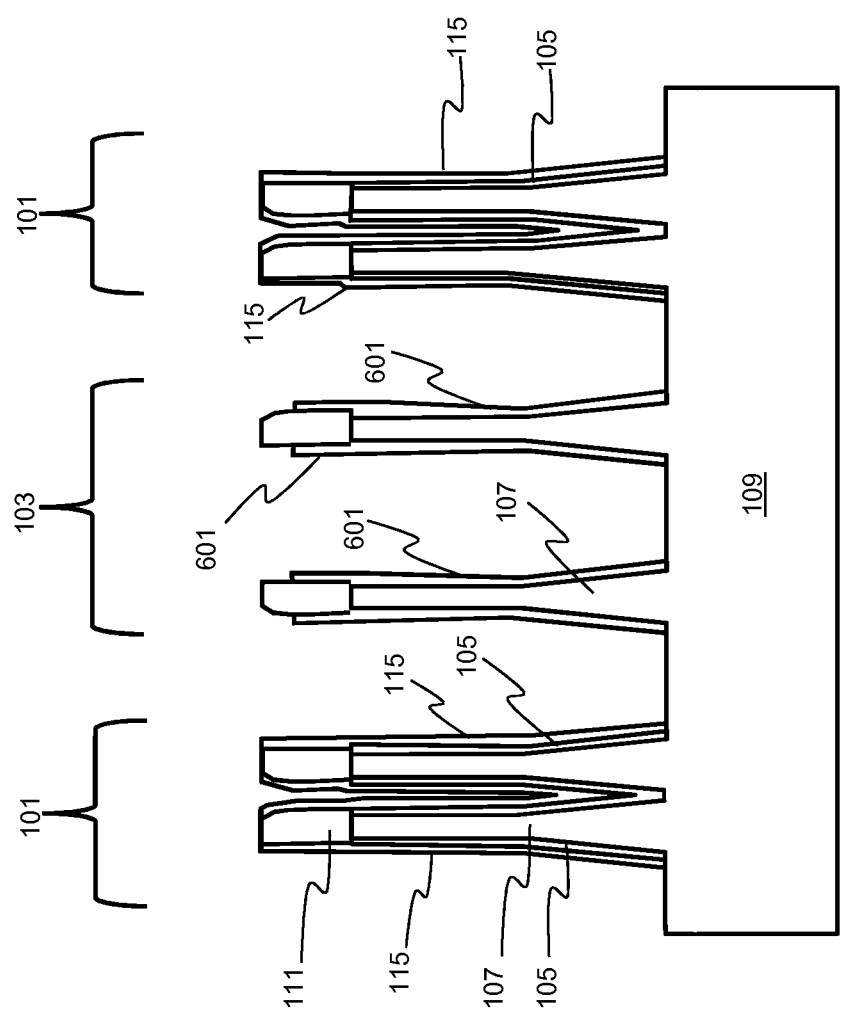
Figure 17:
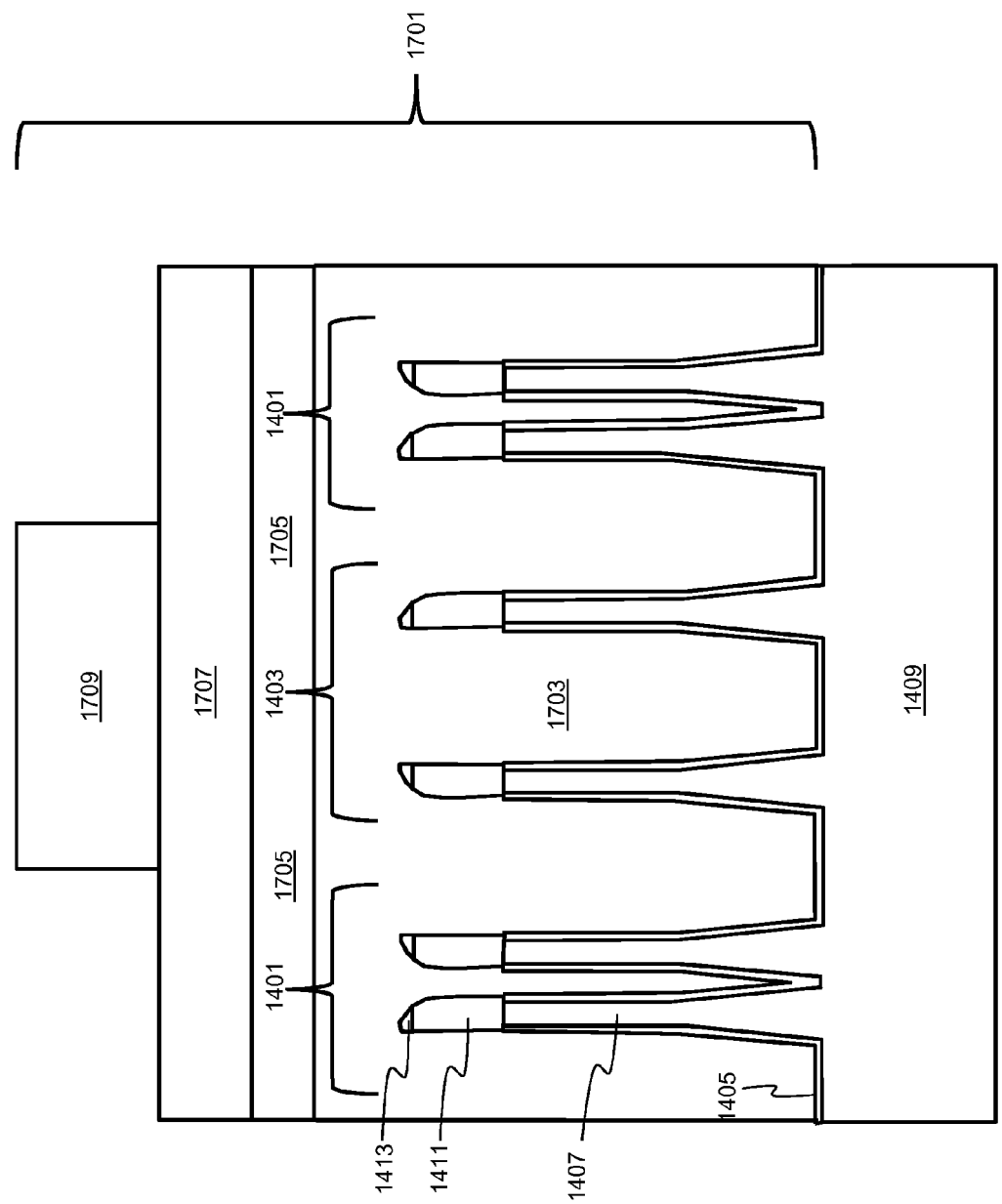
Figure 18:
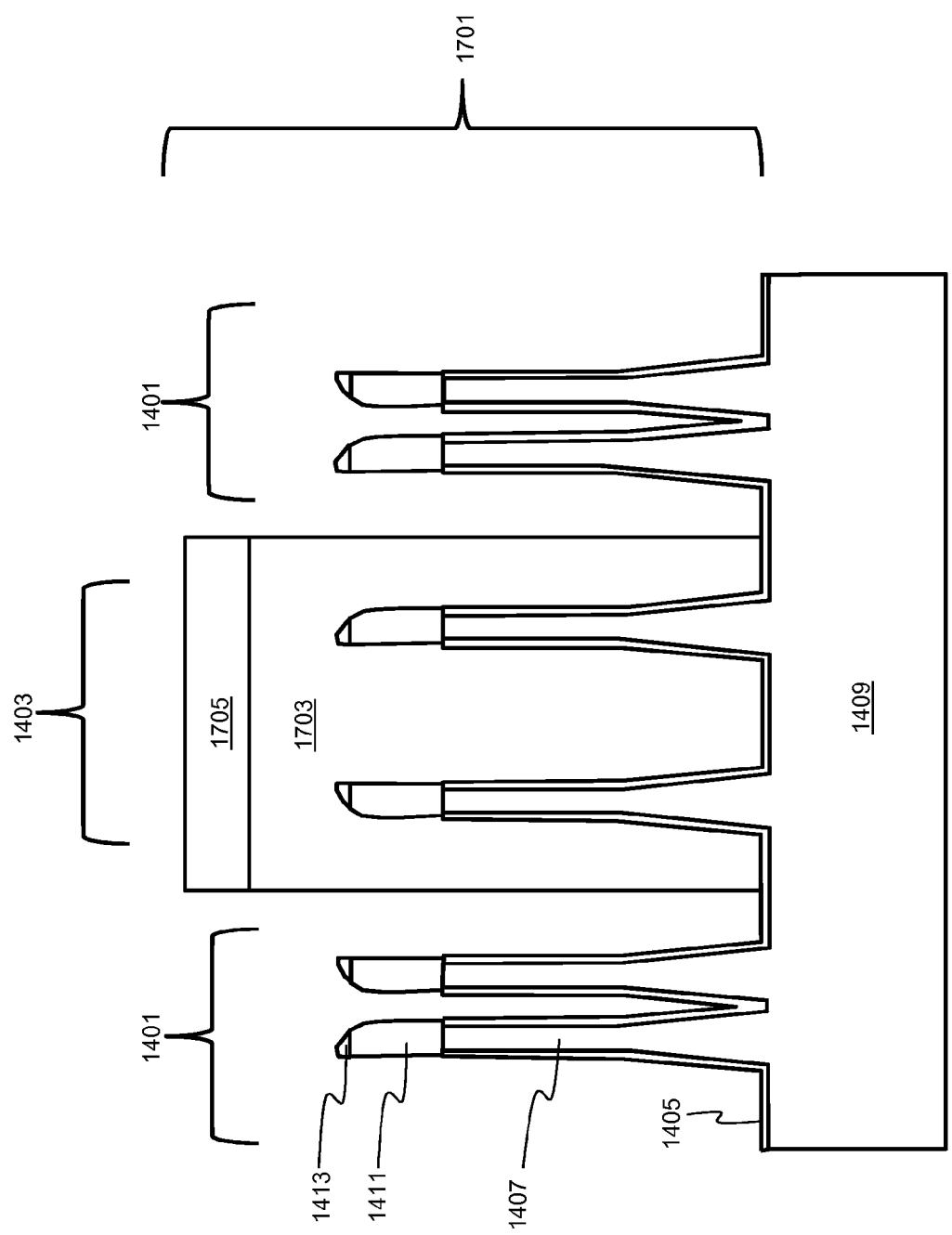

Adverting to FIG. 17, similar to the process flow described with respect to FIGS. 8 and 9, a lithography stack 1701, including a SOH layer 1703, a SiON layer 1705, a BARC layer 1707, and photoresist 1709, is formed over the n-type and p-type fins 1401 and 1403, respectively. The lithography stack 1701 is then opened onto the n-type fins 1401, and the photoresist 1709 and the BARC layer 1707 are removed, as depicted in FIG. 18. Next, a p-well implant is performed into the substrate 1409 through the ISSG or pad oxide layer 1405 of the n-type fins 1401. The p-well implant may be performed, for example, by implanting the substrate 1409 with B/BF$_3$ by PLAD, for example. The p-well implant forms a doped SSRW in the substrate 1409 under the n-type fins 1401. The n-well implant may be performed, for example, at a dosage of 1e12 $cm^{-2}$ to 1e13 $cm^{-2}$ and at an energy of 10 keV to 100 keV. Before, the remainder of the lithography stack 1701 is removed, a SRPD is also performed on the ISSG or pad oxide layer 1405 of the n-type fins 1401. The SRPD may again be performed, for example, at a dosage of 1e19 $cm^{-2}$ to 5e22 $cm^{-2}$ and at an energy of 0.1 keV to 2.5 keV. The remainder of the lithography stack 1701 is then removed from over the p-type fins 1403, down to the substrate 1409.

Figure 11:
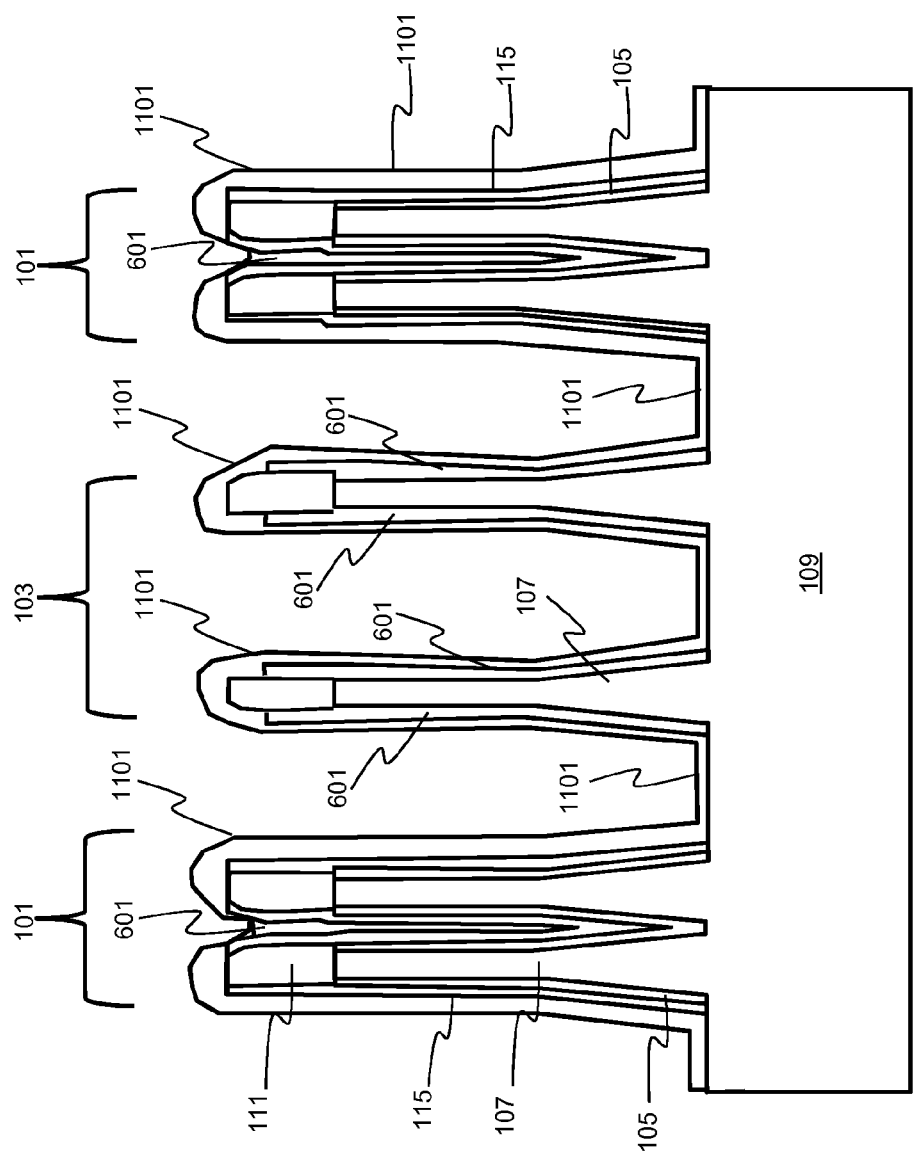
Figure 12:
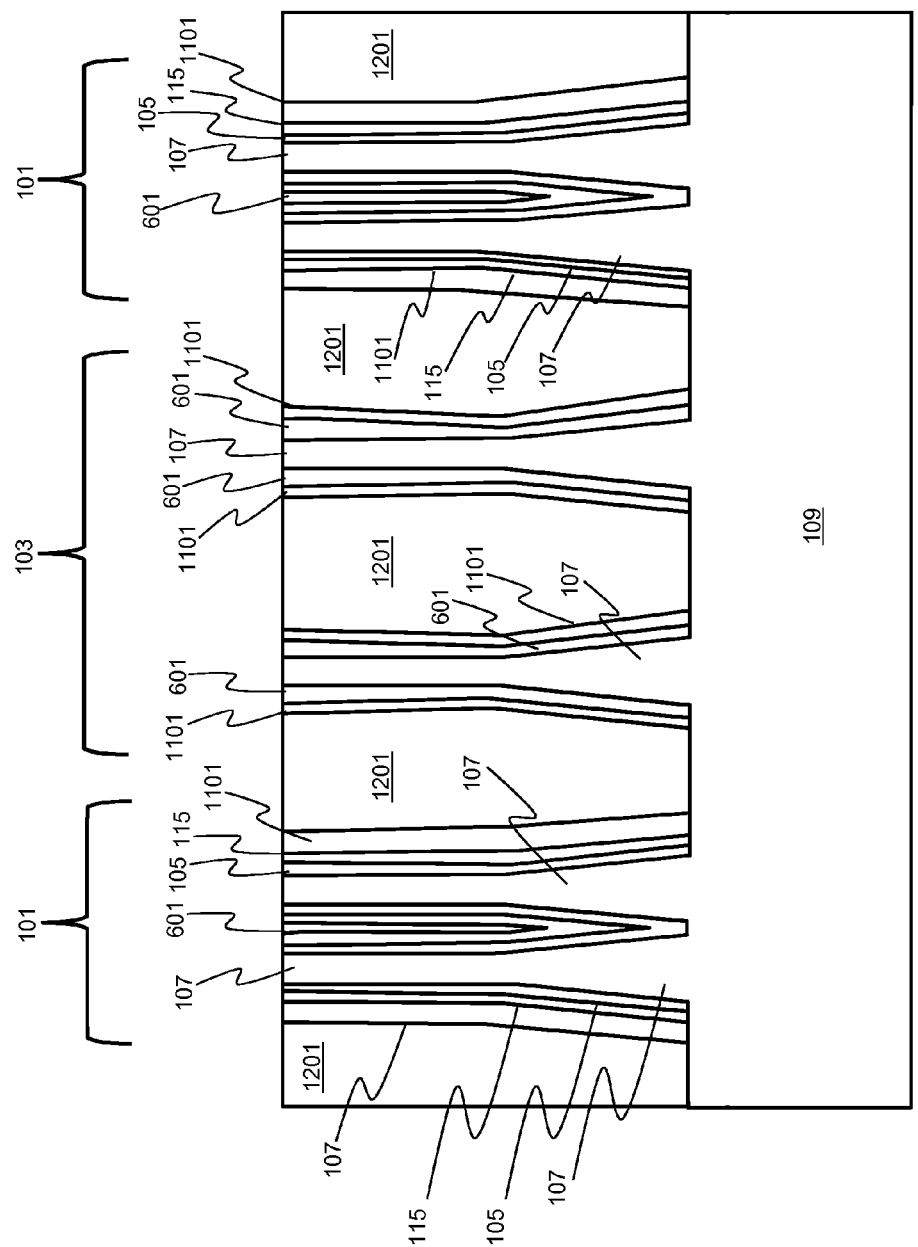
Figure 13:
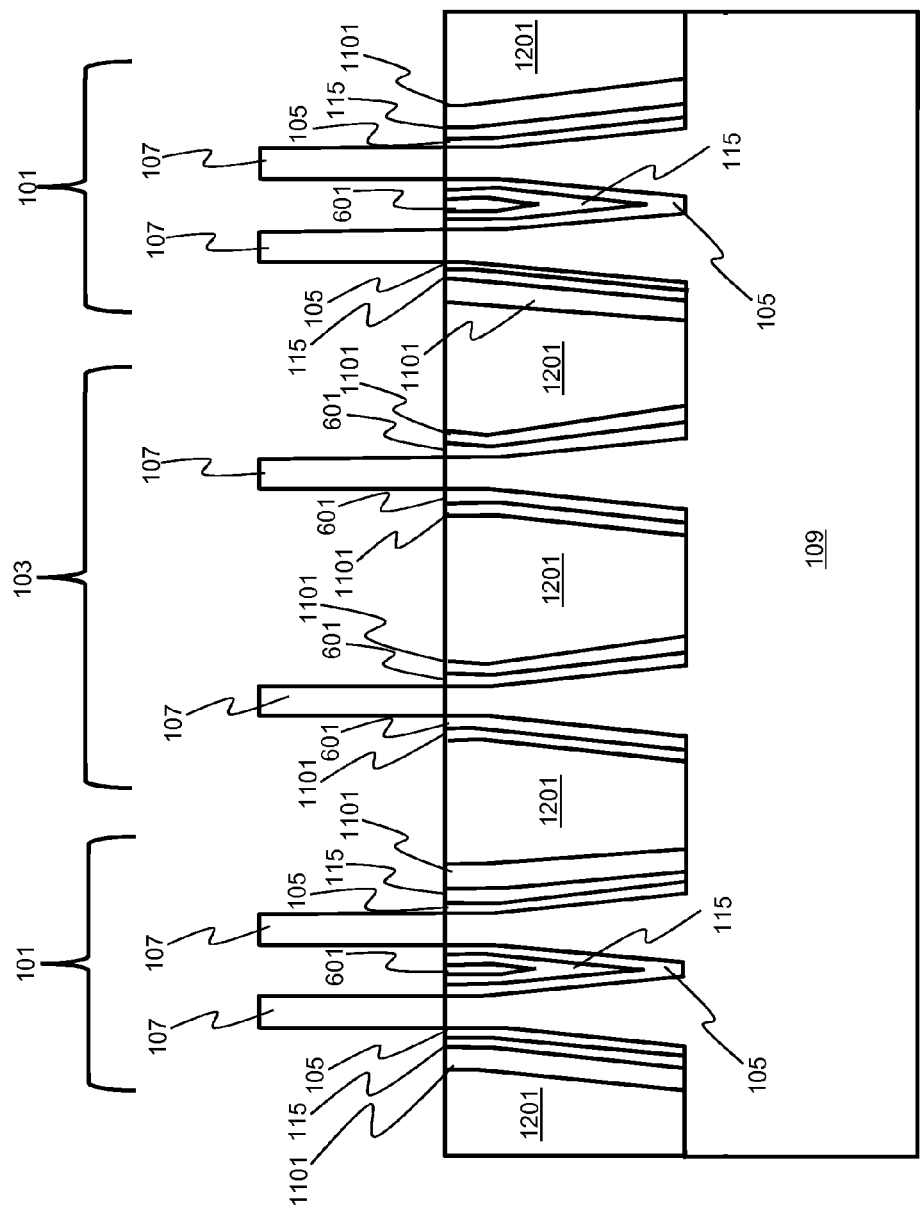
Figure 19:
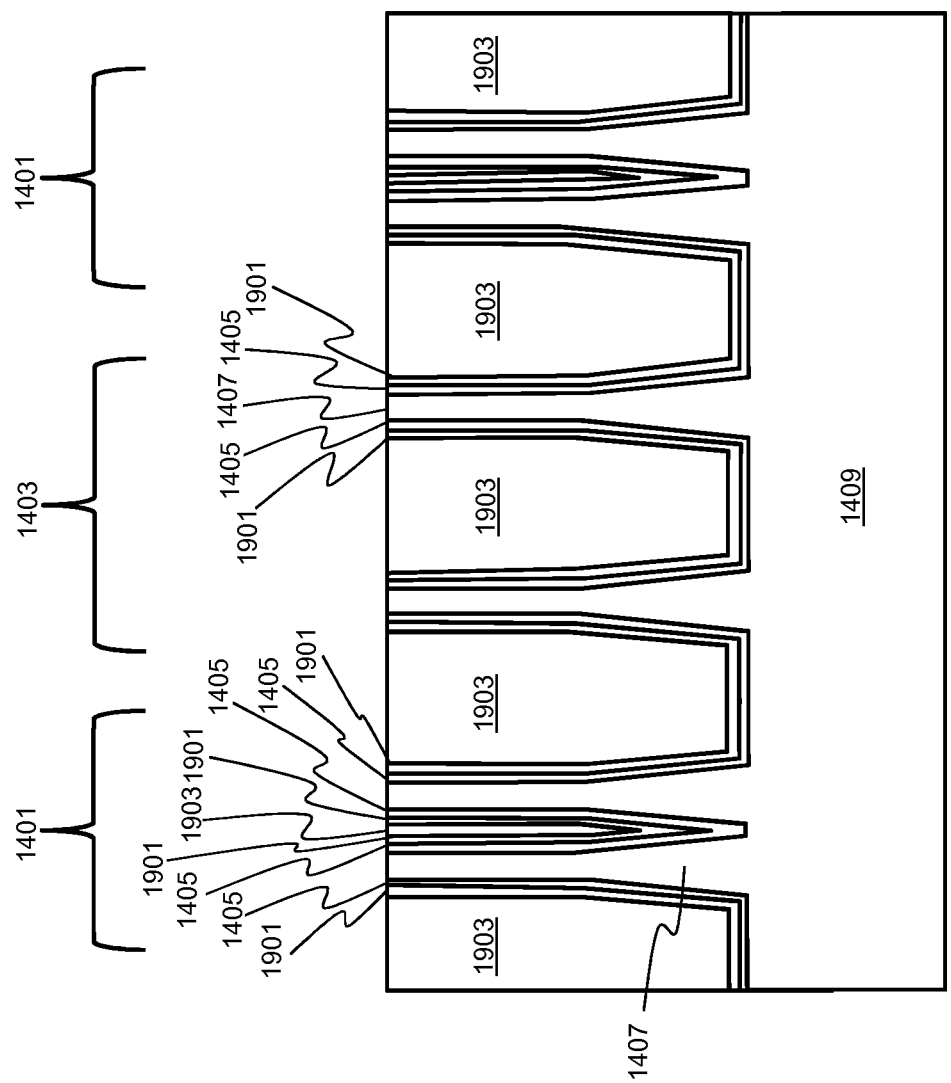
Figure 20:
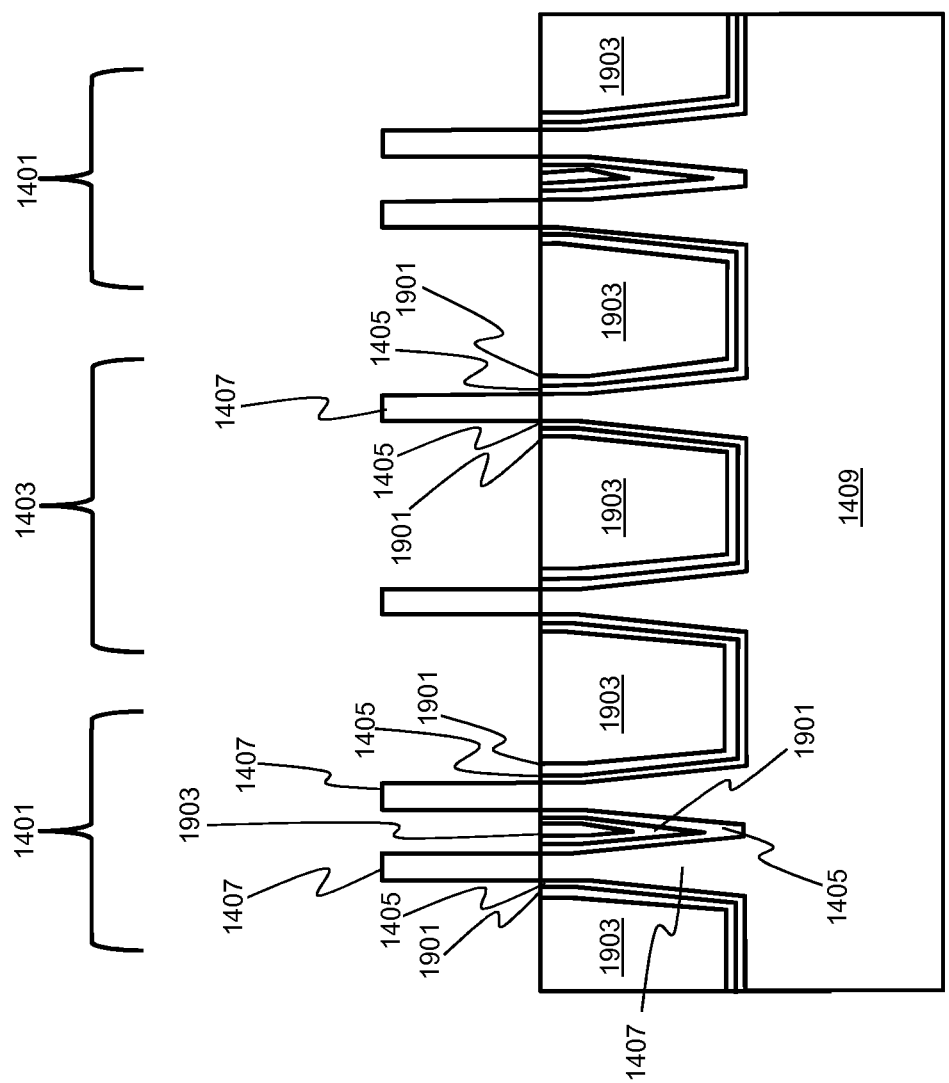

In contrast to the process flow described with respect to FIG. 11, a single nitride layer 1901 is formed, e.g., by ALD or furnace deposition, over the n-type and p-type fins 1401 and 1403, respectively, as depicted in FIG. 19. The nitride layer 1901 may be formed, for example, to a thickness of 0.8 nm to 3.5 nm. Next, similar to the process flow described with respect to FIG. 12, a STI layer 1903 is formed over the nitride layer 1901. The STI layer 1903 is then planarized, for example, by CMP, down to the upper surface of the Si pillars 1407. Adverting to FIG. 20, the STI layer 1903 is then recessed approximately 38 nm to 44 nm to expose a portion of the n-type and p-type fins 1401 and 1403, respectively. The portions of the ISSG or pad oxide layer 1405 and the nitride layer 1901 exposed by the recessed STI layer 1903 are then stripped down to the Si pillars 1407. Thereafter, the dopants are driven into the n-type and p-type fins 1401 and 1403, respectively, by annealing the exposed portions of the n-type fins 1401 and p-type fins 1403 at a temperature of 800° C. to 1200° C.

The embodiments of the present disclosure can achieve several technical effects including a simplified SSRW process flow, reduced processing costs since extra tools and processing and cleaning steps are not required, and ultra-shallow implant depth reducing implant damage/leakage and, therefore, device defectiveness. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a plurality of p-type and n-type fins on a substrate, the plurality of p-type and n-type fins formed with an in-situ steam generation (ISSG) or pad oxide layer;
    performing an n-type well (n-well) implant into the substrate through the ISSG or pad oxide layer;
    performing a first self-regulation plasma doping (SRPD) on the ISSG or pad oxide layer of the plurality of p-type fins;
    performing a p-type well (p-well) implant into the substrate through the ISSG or pad oxide layer;
    performing a second SRPD on the ISSG or pad oxide layer of the plurality of n-type fins; and
    driving the n-well and p-well implants and the SRPD dopants into a portion of the plurality of p-type and n-type fins.

2. The method according to claim 1, comprising forming the plurality of n-type fins by:
    forming a first and a second group of n-type fins, the first and the second group of n-type fins formed on opposite sides of the plurality of p-type fins.

3. The method according to claim 1, comprising forming the plurality of p-type and n-type fins by:
    forming the ISSG or pad oxide layer over a plurality of silicon (Si) pillars formed on the substrate;
    removing the ISSG or pad oxide layer from an upper surface of the plurality of Si pillars;
    forming a nitride cap on the upper surface of each Si pillar; and
    forming an oxide cap on an upper surface of the nitride cap.

4. The method according to claim 1, comprising performing the n-well implant by:
    forming a lithography stack over the plurality of p-type and n-type fins;
    removing a portion of the lithography stack over the p-type fins down to the substrate; implanting phosphorous/arsenic (P/As) into the substrate by plasma doping (PLAD); and
    removing a remaining portion of the lithography stack over the n-type fins down to the substrate.

5. The method according to claim 1, comprising performing the p-well implant by:
    forming a lithography stack over the plurality of p-type and n-type fins;
    removing a portion of the lithography stack over the plurality of n-type fins down to the substrate;
    implanting boron/boron trifluoride (B/BF$_3$) into the substrate by PLAD; and
    removing a remaining portion of the lithography stack over the p-type fins down to the substrate.

6. The method according to claim 1, comprising performing the n-well and p-well implants at a dosage of 1e12 per centimeter squared (cm$^{-2}$) to 1e13 cm$^{-2}$ and at an energy of 10 kiloelectron volt (keV) to 100 keV.

7. The method according to claim 1, comprising performing the first and second SRPD dopings at a dosage of 1e19 cm$^{-2}$ to 5e22 cm$^{-2}$ and at an energy of 0.1 keV to 2.5 keV.

8. The method according to claim 1, driving the n-well and p-well implants and the SRPD dopants into the portion of the plurality of p-type and n-type fins by:
    forming a nitride layer over the plurality of p-type and n-type fins and the substrate;
    forming a shallow trench isolation (STI) layer over the nitride layer;
    planarizing the STI layer down to an upper surface of a plurality of Si pillars of the p-type and n-type fins;
    recessing a portion of the STI layer to expose the portion of the plurality of p-type and n-type fins;
    removing the ISSG or pad oxide and nitride layers from the portion of the plurality of p-type and n-type fins; and
    annealing the portion of the plurality of p-type and n-type fins at a temperature of 800° C. to 1200° C.

9. The method according to claim 8, comprising forming the nitride layer to a thickness of 0.8 nanometer (nm) to 3.5 nm by atomic layer deposition (ALD) or furnace deposition.

10. A method comprising:
    forming a plurality of p-type metal-oxide-semiconductor (PMOS) fins and n-type metal-oxide-semiconductor (NMOS) fins on a substrate, the plurality of PMOS and NMOS fins formed with an in-situ steam generation (ISSG) or pad oxide layer;
    performing a n-type well (n-well) implant into the substrate through the ISSG or pad oxide layer;
    performing a first self-regulation plasma doping (SRPD) on the ISSG or pad oxide layer of the plurality of PMOS fins;
    performing a p-type well (p-well) implant into the substrate through the ISSG or pad oxide layer;
    performing a second SRPD on the ISSG or pad oxide layer on the plurality of NMOS fins;
    forming a nitride layer over the plurality of PMOS and NMOS fins;
    forming a shallow trench isolation (STI) layer over the nitride layer;
    planarizing the STI layer down to an upper surface of a plurality of silicon (Si) pillars of the plurality of PMOS and NMOS fins;
    recessing a portion of the STI layer, the recess exposing a portion of the plurality of PMOS and NMOS fins;
    removing the ISSG or pad oxide and nitride layers from the portion of the plurality of PMOS and NMOS fins; and
    annealing the portion of the plurality of PMOS and NMOS fins.

11. The method according to claim 10, comprising forming the plurality of NMOS fins by:
    forming a first and a second group of NMOS fins, the first and the second group of NMOS fins formed on opposite sides of the plurality of PMOS fins.

12. The method according to claim 10, comprising forming the plurality of PMOS and NMOS fins by:

forming the ISSG or pad oxide layer over the plurality of Si pillars formed on the substrate;

removing the ISSG or pad oxide layer from a top surface of the plurality of Si pillars;

forming a nitride cap on an upper surface of each Si pillar; and forming an oxide cap on an upper surface of the nitride cap.

13. The method according to claim 10, comprising performing the n-well implant by:

forming a lithography stack over the plurality of PMOS and NMOS fins;

removing a portion of the lithography stack over the PMOS fins down to substrate;

implanting phosphorous/arsenic (P/As) into the substrate by plasma doping (PLAD); and removing a remaining portion of the lithography stack over the NMOS fins down to the substrate.

14. The method according to claim 10, comprising performing the p-well implant by:

forming a lithography stack over the plurality of PMOS and NMOS fins;

removing a portion of the lithography stack over the plurality of NMOS fins;

implanting boron/boron trifluoride ($B/BF_3$) into the substrate by PLAD; and removing a remaining portion of the lithography stack over the PMOS fins down to the substrate.

15. The method according to claim 10, comprising performing the n-well and p-well implants at a dosage of 1e12 per centimeter squared ($cm^{-2}$) to 1e13 $cm^{-2}$ and at an energy of 10 kiloelectron volt (keV) to 100 keV.

16. The method according to claim 10, comprising performing the first and second SRPD dopings at a dosage of 1e19 $cm^{-2}$ to 5e22 $cm^{-2}$ and at an energy of 0.1 keV to 2.5 keV.

17. The method according to claim 10, comprising forming the nitride layer to a thickness of 0.8 nanometer (nm) to 3.5 nm by atomic layer deposition (ALD) or furnace deposition.

18. A device comprising:

p-type metal-oxide-semiconductor (PMOS) fins and n-type metal-oxide-semiconductor (NMOS) fins formed on a silicon (Si) substrate, the PMOS and NMOS fins having a top and a bottom portion;

an in-situ steam generation (ISSG) or pad oxide layer formed over the bottom portion of the PMOS and NMOS fins;

a phosphorous/arsenic (P/As) doped super steep retrograde well (SSRW) formed in the substrate under the PMOS fins;

a boron/boron trifluoride ($B/BF_3$) doped SSRW formed in the substrate under the NMOS fins;

a nitride layer formed over the ISSG or pad oxide layer; and a shallow trench isolation (STI) layer formed on the Si substrate adjacent to and between the bottom portion of the PMOS and NMOS fins.

19. The device according to claim 18, wherein a self-regulation plasma doping (SRPD) is performed on the ISSG or pad oxide layer of the PMOS and NMOS fins.

20. The device according to claim 18, wherein the NMOS firms are formed of a first and a second group of NMOS fins, the PMOS fins are formed as a group of PMOS fins, and the first and second groups of NMOS fins formed on opposite sides of the group of PMOS fins.

* * * * *